(12) United States Patent
Liu

(10) Patent No.: US 7,326,590 B2
(45) Date of Patent: Feb. 5, 2008

(54) METHOD FOR MANUFACTURING BALL GRID ARRAY PACKAGE

(75) Inventor: Sheng-Tsung Liu, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 224 days.

(21) Appl. No.: 10/974,772

(22) Filed: Oct. 28, 2004

(65) Prior Publication Data

US 2005/0095752 A1    May 5, 2005

(30) Foreign Application Priority Data

Oct. 29, 2003  (TW) .............................. 92130075 A

(51) Int. Cl.
- *H01L 21/00*   (2006.01)
- *H01L 21/30*   (2006.01)
- *H01L 23/28*   (2006.01)
- *H01L 23/29*   (2006.01)

(52) U.S. Cl. .......................... 438/106; 438/33; 438/59; 438/64; 438/66; 438/67; 438/68; 438/107; 438/110; 438/114; 438/458; 438/460; 257/758

(58) Field of Classification Search .................... None
See application file for complete search history.

(56) References Cited

U.S. PATENT DOCUMENTS

| | | | | |
|---|---|---|---|---|
| 5,612,513 A | * | 3/1997 | Tuttle et al. ................ | 174/260 |
| 5,750,421 A | * | 5/1998 | Kasai et al. ................ | 438/106 |
| 5,866,953 A | * | 2/1999 | Akram et al. ............... | 257/790 |
| 6,396,138 B1 | * | 5/2002 | Cheah ......................... | 257/692 |
| 6,538,311 B2 | * | 3/2003 | Bolken ........................ | 257/679 |
| 6,670,220 B2 | * | 12/2003 | Sakuraba et al. ........... | 438/109 |
| 6,830,957 B2 | * | 12/2004 | Pu et al. ..................... | 438/108 |
| 6,887,739 B2 | * | 5/2005 | Fujisawa et al. ............ | 438/110 |
| 2001/0049159 A1 | * | 12/2001 | Hsu et al. .................... | 438/112 |
| 2002/0096789 A1 | * | 7/2002 | Bolken ........................ | 257/787 |
| 2004/0106234 A1 | * | 6/2004 | Sorg et al. ................... | 438/123 |

FOREIGN PATENT DOCUMENTS

JP          61095583        *   5/1986

* cited by examiner

*Primary Examiner*—Carl Whitehead, Jr.
*Assistant Examiner*—James M Mitchell
(74) *Attorney, Agent, or Firm*—Bacon & Thomas, PLLC

(57) ABSTRACT

A method for manufacturing a ball grid array package includes the steps of providing a substrate strip having a plurality of sub-substrate strips wherein each has an upper surface and a lower surface, disposing a plurality of chips on the upper surfaces of the sub-substrate strips, forming a plurality of encapsulation bodies for encapsulating the chips on the upper surfaces respectively, and forming a plurality of ribs between the encapsulation bodies.

10 Claims, 4 Drawing Sheets

METHOD FOR MANUFACTURING BALL GRID ARRAY PACKAGE

BACKGROUND OF THE INVENTION

1. Field of Invention

This invention relates to a manufacturing method of forming a ball grid array package. More particularly, the present invention is related to a manufacturing method of forming a ball grid array package for enhancing the stiffness of the substrate strips and avoiding the substrate strips from being warped before the substrate strips are separated into a plurality of individual substrate units encapsulated in said ball grid array package.

2. Related Art

In this information explosion age, integrated circuits products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. However, ball grid array packages are the main assembly products and packages recently.

As mentioned above, a conventional ball grid array package mainly comprises a chip and a substrate. The substrate has an upper surface and a lower surface. The chip is disposed on the upper surface; the substrate has a plurality of conductive traces formed therein for electrically connecting the upper surface and the lower surface; and the chip is electrically connected to the conductive traces of the substrate by a plurality of wires. In addition, an encapsulation material is provided to form an encapsulation body to enclose the chip, the wires, and to cover the upper surface of the substrate. Furthermore, a plurality of solder balls are formed on the lower surface of the substrate to be regarded as external terminals or contacts for electrically and physically connecting to external devices.

Refer to FIGS. 1 and 2, which disclose the progresses of manufacturing a conventional ball grid array package 60. Therein, a substrate strip 30 having a plurality of substrate units 20 is provided as shown in FIG. 1. Therein, each of the substrate unit 20 has an upper surface 22 and a lower surface 24 respectively. A plurality of chips 10 are disposed on the upper surfaces 22 of the substrate units 20. Therein, said each upper surface has at least one chip formed thereon. Next, a plurality of encapsulation bodies 40 are formed on each of the upper surfaces 22 of the substrate units respectively and cover the chips 20 respectively. Furthermore, a plurality of solder balls 50 or other electrically conductive devices are formed on the lower surfaces 24 of the substrate units 20. Finally, a singulation or dicing process is performed to separate the encapsulation bodies 40 from each other so as to form a plurality of ball grid array packages 60 with said encapsulation bodies enclosing the chips therein.

However, as shown in FIG. 3, the coefficient of thermal expansion of the substrate strip 30 is much different from that of the encapsulation bodies 40. Hence, when the encapsulation bodies 40 are cooled down to the room temperature, the substrate strip 30 with the encapsulation bodies 40 formed thereon will be warped. De facto, the substrate strip 30 is usually warped at the interconnection between the substrate strip 30 and the encapsulation bodies 40. When the substrate strip 30 is warped, the solder balls 50 or other conductive terminals formed on the lower surfaces 24 of the substrate units 20 are not coplanar with each other. Hence, when the substrate strip 30 with encapsulation bodies 40 formed thereon is singulated or diced into a plurality of individual substrate units 20 through the cutting line 12 and then the individual substrate units are disposed on a printed circuit board, it is very difficult to well dispose the individual substrate units 20 on the printed circuit board. In addition, the warpage will become larger and larger accompanying with the increase of the width or length of the substrate units and the reduction of the thickness of the substrate units 20. In other words, the warpage will restrict the design freedom of the thickness of the substrate units and the size, such as length or width, of the substrate units.

Therefore, providing another manufacturing method to solve the mentioned-above disadvantages is the most important task in this invention.

SUMMARY OF THE INVENTION

In view of the above-mentioned problems, an objective of this invention is to provide a manufacturing method of forming a ball grid array package for enhancing the stiffness of the substrate strip and avoiding the substrate strip being warped.

To achieve these and other advantages and in accordance with the purpose of the invention, as embodied and broadly described herein, the invention specifically provides a manufacturing method of forming a ball grid array package. Therein, the method comprises the steps of providing a substrate strip having a plurality of sub-substrate strips wherein each sub-substrate strip has an upper surface and a lower surface, disposing chips on said upper surfaces of said sub-substrate strips, forming a plurality of encapsulation bodies on the upper surfaces wherein the encapsulation bodies encloses said chips, and forming a plurality of ribs between the encapsulation bodies for connecting the encapsulation bodies.

In accordance with this invention as shown above, the stiffness of the substrate strip will be enhanced by forming the ribs between the encapsulation bodies. Hence, the substrate strip will be prevented from being warped. Thus, the solder balls formed on the lower surfaces of the sub-substrate strips will be kept coplanar with each other so as to increase the assembly yield of the packaging products.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
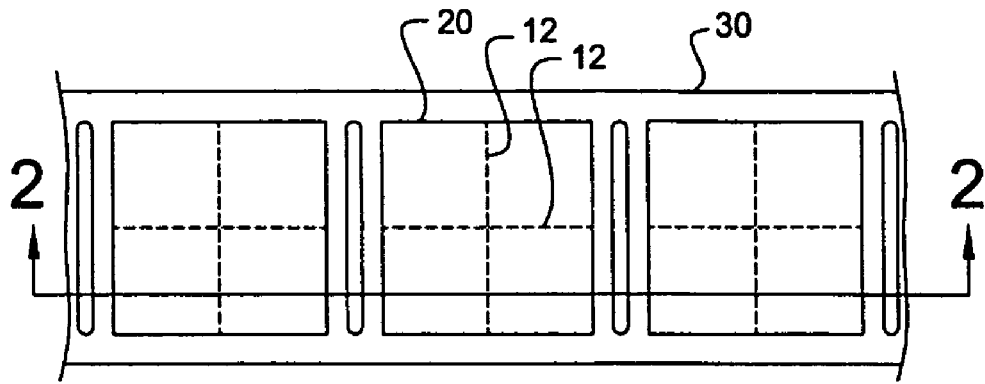
FIG. 1 is a top view of conventional ball grid array packages.
Figure 2:
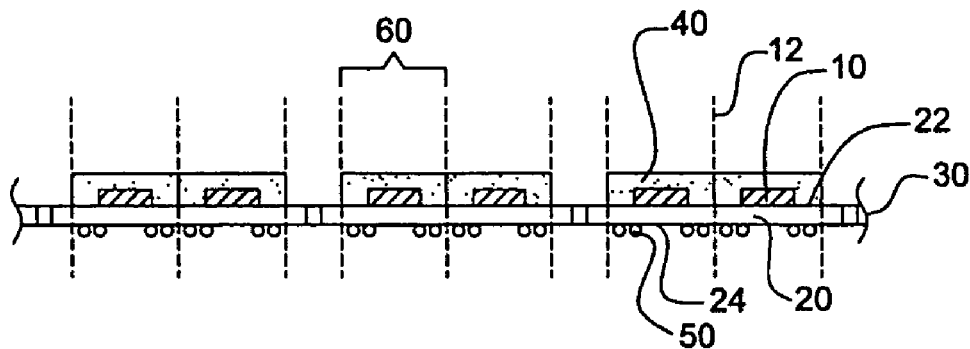
FIG. 2 is a cross-sectional view of ball grid array packages along line 2-2 of FIG. 1.
Figure 3:
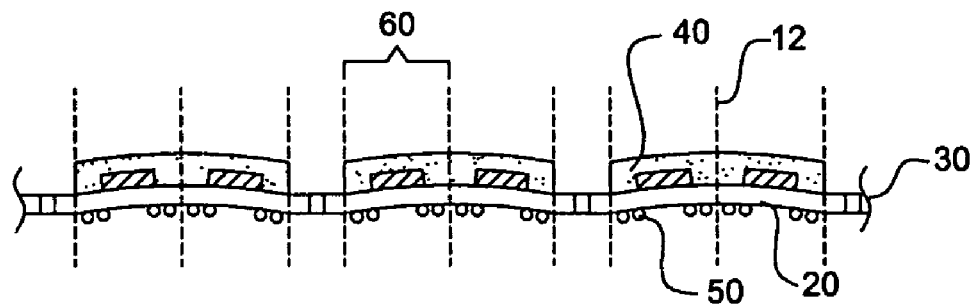
FIG. 3 is a cross-sectional view of conventional ball grid array packages with a warped substrate strip formed therein.

The manufacturing method thereof according to the preferred embodiment of this invention will be described herein below with reference to the accompanying drawings, wherein the same reference numbers are used in the drawings and the description to refer to the same or like parts.

As shown from FIGS. 4 to 10, which illustrate the progression of steps of forming a ball grid array package 160 according to the preferred embodiment of this invention.

Figure 4:
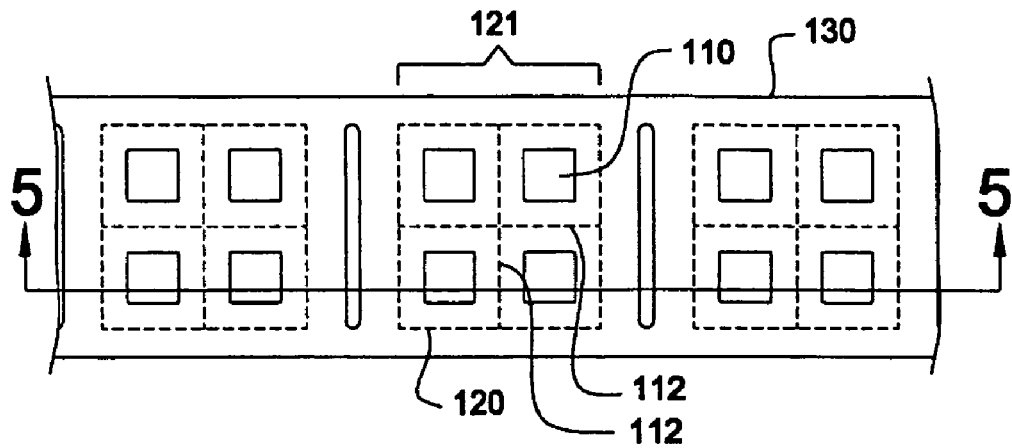
FIGS. 4 to 10 are partially enlarged cross-sectional views showing the progression of steps of forming a ball grid array package according to the preferred embodiment of this invention.
Figure 5:
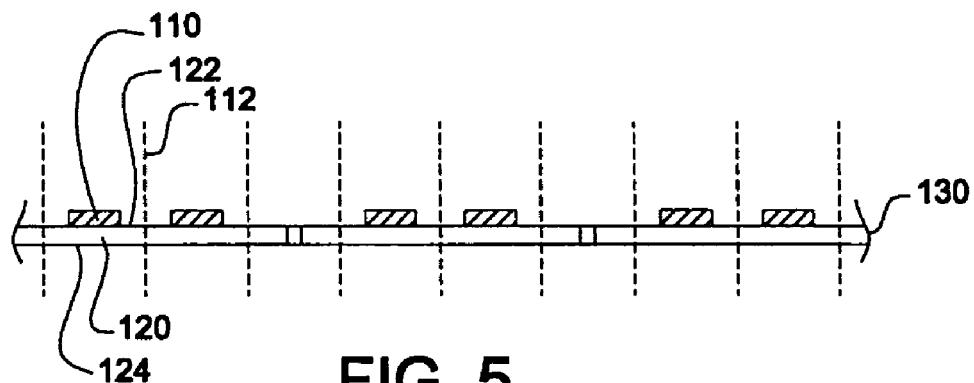

Referring to FIGS. 4 and 5, a substrate strip 130 includes a plurality of sub-substrate strips 121, wherein each of the sub-substrate strips 121 has at least one substrate unit 120 or a plurality of substrate units 120 arranged in a matrix. As shown in FIG. 4, the sub-substrate strip 121 has four substrate units arranged in a 2×2 matrix. Each substrate unit 120 has an upper surface 122 and a lower surface 124. Next, a plurality of chips 110 are disposed on the upper surfaces 122 of the substrate units 120. Therein, the chips 110 can be wire-bonding chips and are electrically connected to the substrate units 120 through wires (not shown).

Figure 6:
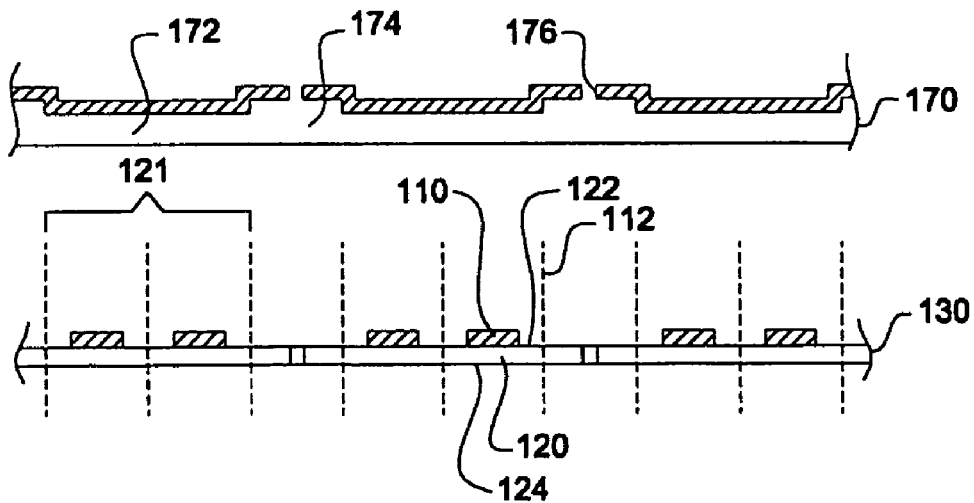
Figure 7:
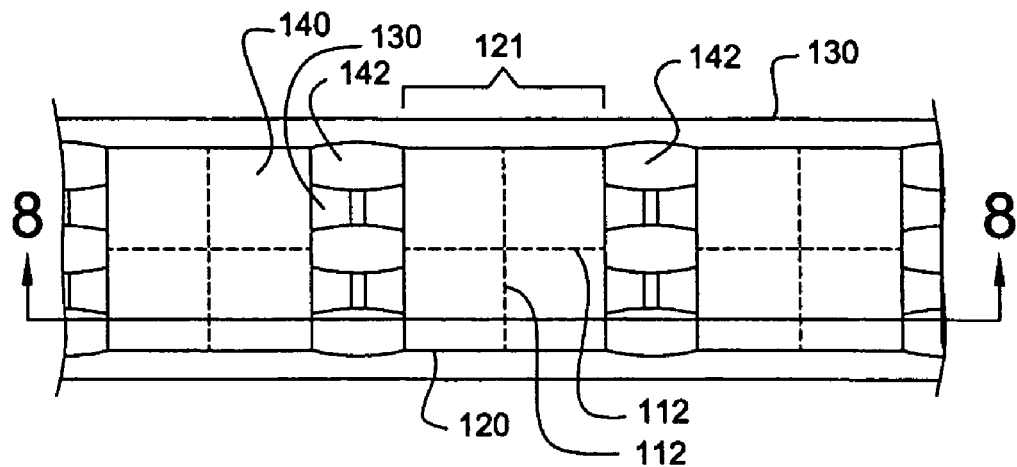
Figure 8:
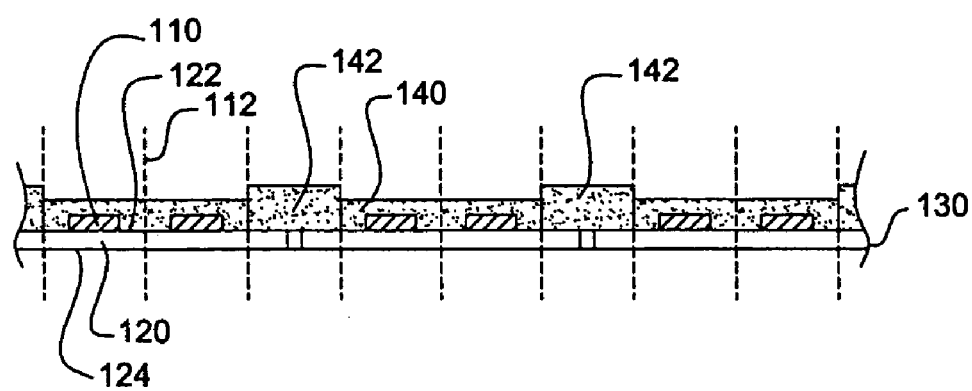
Figure 9:
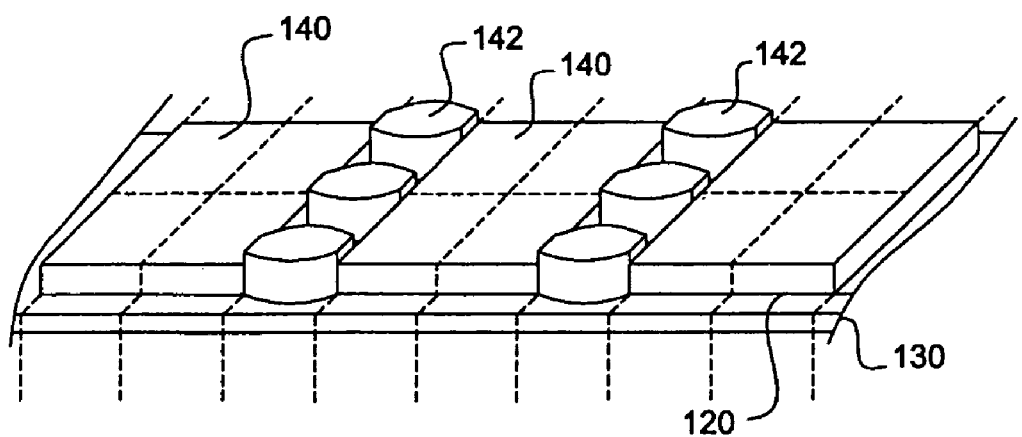

Referring to FIG. 6, a mold 170 is placed over the upper surfaces 122 of the substrate strip 130 and an encapsulation material is injected into the mold 170 so as to cover the chips 110. Therein, the mold 170 has a plurality of first mold chases 172 and a plurality of second mold chases 174, and the first mold chases 172 are arranged correspondently with the sub-substrate strips 121 respectively and are utilized to cover the chips 110. The second mold chases 174 are arranged between the first mold chases 172 for manufacturing a plurality of ribs 142 as shown in FIGS. 7, 8 and 9. Besides, the second mold chases 174 have a plurality of inlet 176 for injecting the encapsulation material into the mold 170 therethrough.

Referring to FIGS. 7, 8 and 9 again, which illustrate the substrate strip 130 having a plurality of encapsulation bodies 140 and ribs 142 between the encapsulation bodies 140, after the processes of molding and removing the mold 170 are performed. To be noted, the thickness of one of the ribs 142 is larger than the thickness of the encapsulation body 140 connecting to the rib 142. The center of the strengthening rib is wider than the end of the strengthening rib aside the encapsulation body.

As mentioned above, the stiffness of the substrate strip 130 can be increased and the structure of the substrate strip 130 can be enhanced by the ribs 142 which connect the encapsulation bodies 140. Thus, the substrate strip 130 can be prevented from being warped.

Figure 10:
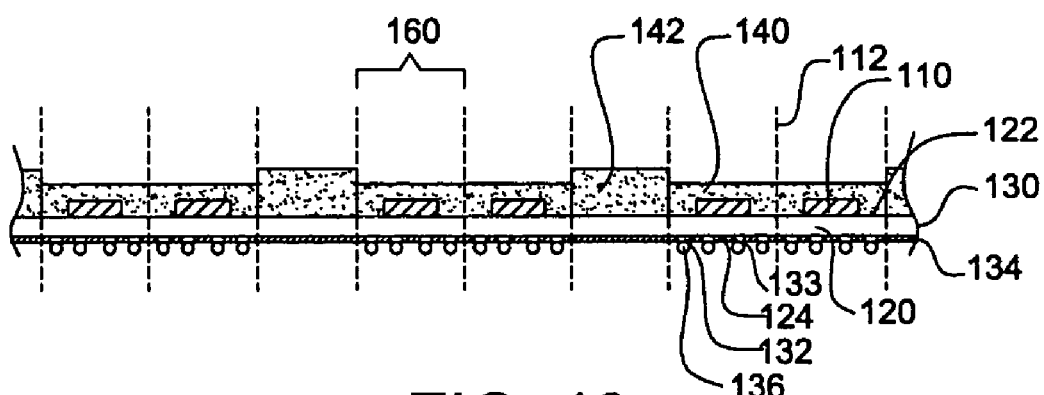

Afterwards, referring to FIG. 10, which illustrates a plurality of contacts 132 formed on the lower surface 124 of the substrate unit 120. A solder mask 134 is formed on the lower surface 124 and left the contacts 132 exposed through a plurality of openings 133. In addition, a plurality of solder balls 136 are disposed on the contacts 132.

Next, a singulation or dicing process is performed on the substrate strip 130 through a plurality of cutting lines 112 to separate the substrate strip 130 into a plurality of individual substrate units 120. Namely, a plurality of ball grid array packages 160 with individual substrate units 120 formed therein are formed. To be noted, the singulation or dicing process may be performed by a punch method or a sawing process.

Per mentioned above manufacturing processes, the substrate strip 130 is not warped. Hence, the solder balls 136 formed on the individual substrate unit 120 can be coplanar with each other so as to increase the assembly yield of the such grid array packaging products.

Although the invention has been described in considerable detail with reference to certain preferred embodiments, it will be appreciated and understood that various changes and modifications may be made without departing from the spirit and scope of the invention as defined in the appended claims.

What is claimed is:

1. A manufacturing method of forming a ball grid array package, the method comprising steps of:
    providing a substrate strip having a plurality of sub-substrate strips, wherein each of said sub-substrate strips has an upper surface and a lower surface, respectively;
    disposing a plurality of chips on the upper surfaces, wherein each of said upper surfaces has at least one of the chips formed thereon; and
    forming a plurality of encapsulation bodies and a plurality of discrete strengthening ribs located between each of the encapsulation bodies on the upper surfaces, wherein the encapsulation bodies encapsulate the chips and the strengthening ribs connect opposing sides of adjacent encapsulation bodies, a gap exists between adjacent strengthening ribs to expose the sub-substrate strip, and the thickness of the strengthening ribs is larger than the thickness of the encapsulation body to which the strengthening ribs connect; wherein at least one rib is connected to a plurality of encapsulation bodies on a same side.

2. The method of claim 1, wherein each of the sub-substrate strips has at least one substrate unit.

3. The method of claim 2, further comprising a step of dicing the substrate units of the sub-substrate strips so as to separate the substrate units from each other and remove the strengthening ribs to form a plurality of individual substrate units.

4. The method of claim 2, further comprising a step of providing a mold to enclose the chips and the substrate units of the sub-substrate strips so as to form the encapsulation bodies and the strengthening ribs in the mold.

5. The method of claim 4, wherein the mold has a plurality of first mold chases and a plurality of second mold chases and the second mold chases connect the first mold chases.

6. The method of claim 5, wherein the encapsulation bodies are formed on the upper surfaces of the sub-substrate strips by providing an encapsulation material in the first mold chases.

7. The method of claim 5, wherein the strengthening ribs are formed between the encapsulation bodies by providing an encapsulation material in the second mold chases.

8. The method of claim 1, further comprising a step of forming a plurality of contacts formed on the lower surfaces.

9. The method of claim 8, further comprising a step of forming a solder mask on the lower surfaces, wherein the solder mask has a plurality of openings exposing the contacts.

10. The method of claim 9, further comprising a step of disposing a plurality of solder balls on the contacts.

* * * * *